United States Patent
Xie et al.

(12)

(10) Patent No.: US 6,274,491 B1
(45) Date of Patent: Aug. 14, 2001

(54) PROCESS OF MANUFACTURING THIN BALL GRID ARRAY SUBSTRATES

(75) Inventors: Wan Le Xie; Fu Yu Huang; Yung-Cheng Chuang; Ning Huang; Chung Ming Chang; Hui-Pin Chen; Chia-Chieh Hu; Feng Chang Tu; Hsuan Jui Chang; Hua Wen Chiang, all of Taipei (TW)

(73) Assignee: Orient Semiconductor Electronics Limited, Kaohsiung (TW)

( * ) Notice: Subject to any disclaimer, the term of this patent is extended or adjusted under 35 U.S.C. 154(b) by 0 days.

(21) Appl. No.: 09/636,315

(22) Filed: Aug. 11, 2000

(51) Int. Cl.⁷ .................................................. H01L 21/44

(52) U.S. Cl. ......................... 438/669; 438/687; 438/107; 438/109; 438/612

(58) Field of Search ............................ 438/687, 612–617, 438/106, 107, 108, 109, 669

(56) References Cited

U.S. PATENT DOCUMENTS

| | | | |
|---|---|---|---|
| 5,843,806 | * 12/1998 | Tsai | 438/107 |
| 5,949,141 | * 9/1999 | Farnworth et al. | 257/737 |
| 5,990,553 | * 11/1999 | Morita et al. | 257/729 |

FOREIGN PATENT DOCUMENTS

-02000049254- * 2/2000 (JP) .............................. H01L/23/12

* cited by examiner

*Primary Examiner*—Charles Bowers
*Assistant Examiner*—Thanh Nguyen
(74) *Attorney, Agent, or Firm*—A & J

(57) ABSTRACT

A process of manufacturing thin ball array substrates includes the steps of: using a layer of polyimide film as a carrier, electroplating a thin copper layer on the polyimide film, electroplating a thick copper layer on the thin copper layer, applying photosensitive coating layers on both sides of the carrier, mounting two masks with optically transmissible circuit tracks on two sides of the carrier and then processing the carrier with exposure treatment, processing the carrier with development treatment so as to remove the photosensitive coating layers aligned with the circuit track thereby forming recessed circuit tracks on the photosensitive coating layers, electroplating a copper layer on a top of the carrier thereby forming an additional copper layer on the thick copper layer, etching a bottom of the carrier to remove the upper recessed circuit track thereon, coating the copper layer on the upper recessed circuit track with soldering metallic material so as to make a top of the soldering metallic material, washing away the photosensitive coating layers with chemical agent, and removing surplus copper layer to remain in circuit lines and the soldering metallic material, whereby a thin ball grid array substrate with thicker circuit lines without remaining electroplating lines can be obtained.

1 Claim, 6 Drawing Sheets

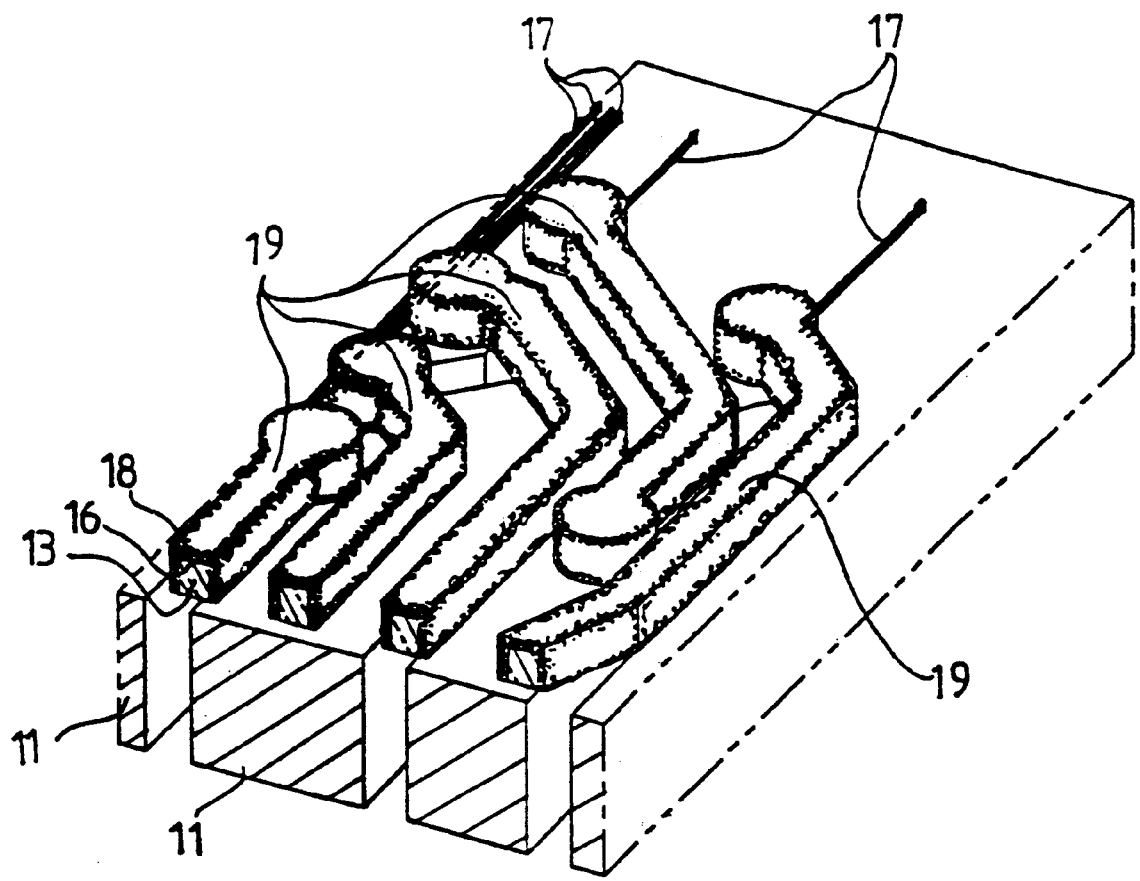
FIG. 1 ℓ

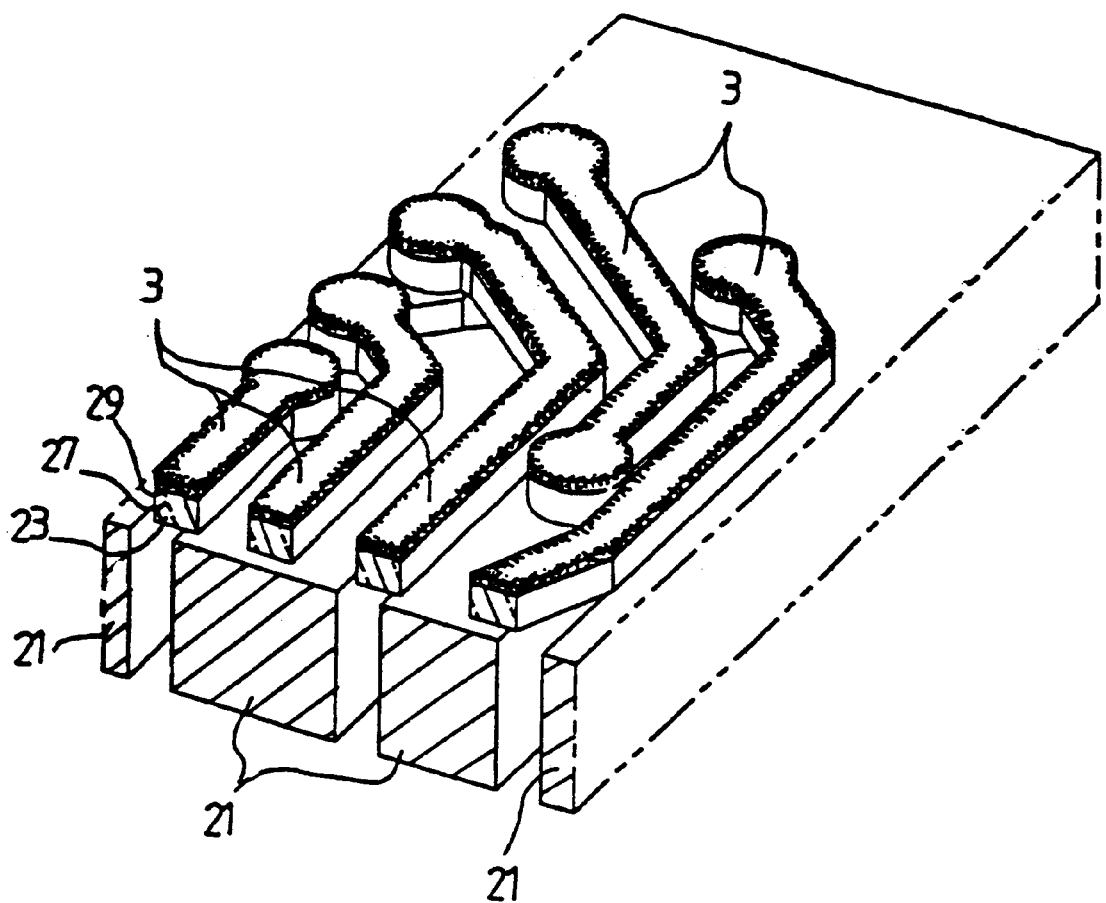
FIG. 2 ℓ

PROCESS OF MANUFACTURING THIN BALL GRID ARRAY SUBSTRATES

BACKGROUND OF THE INVENTION

1. Field of the Invention

This invention is related to a process of manufacturing thin ball grid array substrates and in particular to one which can provide a thin ball grid array substrate with thicker circuit lines without electroplating bus lines remaining.

2. Description of the Prior Art

Lightness, thinness and compactness are requisites for portable electronic devices, and so thin ball grid array substrates are widely used in these devices for achieving these purposes. The conventional process of manufacturing thin ball grid array falls into two categories, i.e. electrolytic electroplating and chemical electroplating.

The electrolytic electroplating process includes the following steps:

a. utilizing apolyimide film as a carrier 11;

b. forming a thin copper layer 12 on the carrier 11 by sputtering;

c. forming a thick copper 13 (which is thicker that the thin copper layer 12) on the thin copper layer 12 by flash plating;

d. coating the top and bottom surfaces of the carrier 11 with a layer of photosensitive material 14;

e. mounting a mask 15 with optically transmissible circuit track 151 on each of the top and bottom sides of the carrier 11, and then processing the carrier with exposure treatment;

f. processing the carrier 11 with development treatment to remove the photosensitive material aligned to the circuit track 151 thereby forming a recessed electrical circuit track diagram;

g. forming a copper layer 16 on the top surface of the carrier 11 by electroplating so that the copper layer 16 is coated on the copper layer 13 forming the recessed electrical circuit track with a top surface even with the photosensitive material layer 14;

h. etching the bottom of the carrier 11 so as to remove the polyimide film aligned with the circuit track of the mask 15;

i. washing away photosensitive material with chemicals;

j. removing surplus copper layer 13 resulting in the circuit lines 19 and the electroplating bus lines 17 remaining (see FIG. 1*l*); and k. connecting electroplating bus lines 17 to positive and negative electrodes of an electroplating apparatus to coat a metal layer 18 of nickel, gold, or the like on the circuit lines 19.

Although the electrolytic electroplating process can provide thicker circuits and enables a manufacturer to select one of a number of metals to coat on the copper circuit, the electroplating bus lines 17 will remain, thereby often causing delay in high speed signal transmission, producing noise, and attenuating signal energy.

The chemical electroplating process can form an additional coating of nickel, gold, tin, or the like to cover the electroplating lines on the circuit, but the coating thickness is limited. Accordingly, there is no process which can provide a thick circuit without electroplating bus lines.

Therefore, it is an object of the present invention to provide a process of manufacturing thin ball grid array substrates.

SUMMARY OF THE INVENTION

This invention is related to a process of manufacturing thinf ball grid array substrates and in particular to one which can provide a thin ball grid array substrate with thicker circuit lines without electroplating lines remaining.

It is the primary object of the present invention to provide a process of manufacturing thin ball array substrates which includes the steps of: using a layer of polyimide film as a carrier, sputtering a thinner copper layer on the polyimide film, flash plating a thicker copper layer on the thinner copper layer, applying photosensitive coating layers on both sides of the carrier, mounting two masks with optically transmissible circuit tracks on two sides of the carrier and then processing the carrier with exposure treatment, processing the carrier with development treatment so as to remove the photosensitive coating layers aligned with the circuit track thereby forming recessed circuit tracks on the photosensitive coating layers, electroplating a copper layer on a top of the carrier thereby forming an additional copper layer on the thicker copper layer, etching the bottom of the carrier to remove the upper recessed circuit track thereon, coating the copper layer on the upper recessed circuit track with soldering metallic material so as to make a top of the soldering metallic material, washing away the photosensitive coating layers with a chemical agent, and removing the surplus copper layer to remain in circuit lines and the soldering metallic material.

The foregoing object and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts. Many other advantages and features of the present invention will become manifest to those versed in the art upon making reference to the detailed description and the accompanying sheets of drawings in which a preferred structural embodiment incorporating the principles of the present invention is shown by way of illustrative example.

BRIEF DESCRIPTION OF THE DRAWINGS

FIG. 1*l* is a perspective view of FIG. 1*f*;

FIG. 2*l* is a perspective view of FIG. 2*f*.

DETAILED DESCRIPTION OF THE PREFERRED EMBODIMENT

Figure 1A:
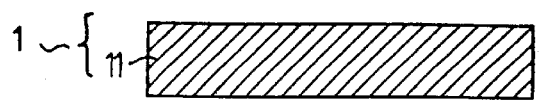
FIGS. 1*a*, 1*b*, 1*c*, 1*d*, 1*e*, 1*d*, 1*f*, 1*g*, 1*h*, 1*i*, 1*j* and 1*k* illustrate the conventional electrolytic electroplating process of manufacturing thin ball grid array substrates.
Figure 1B:
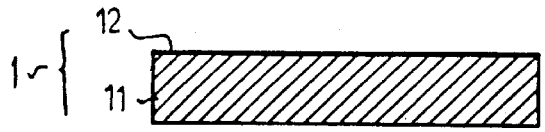
Figure 1C:
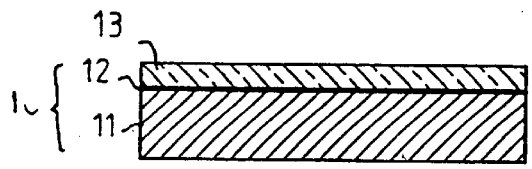
Figure 1D:
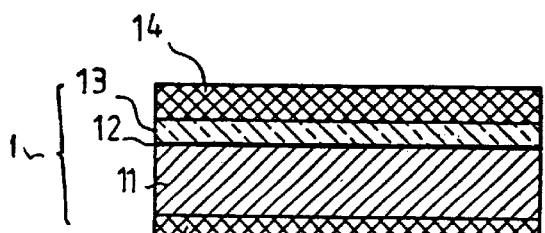
Figure 1E:
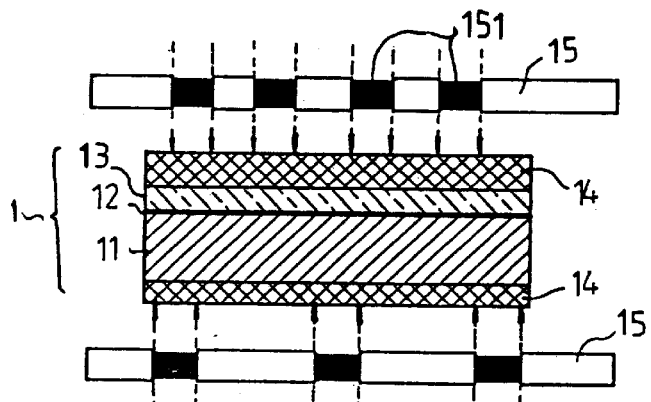
Figure 1F:
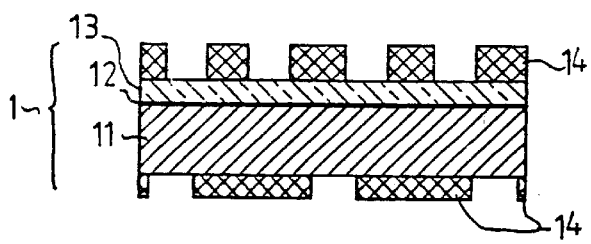
Figure 1G:
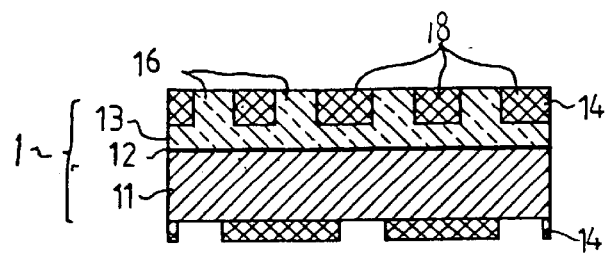
Figure 1H:
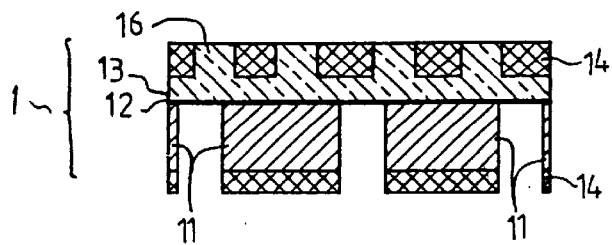
Figure 1I:
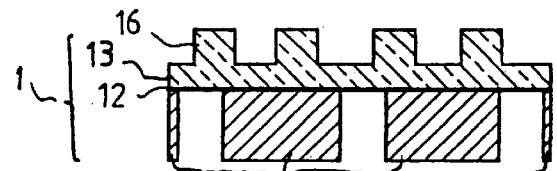
Figure 1J:
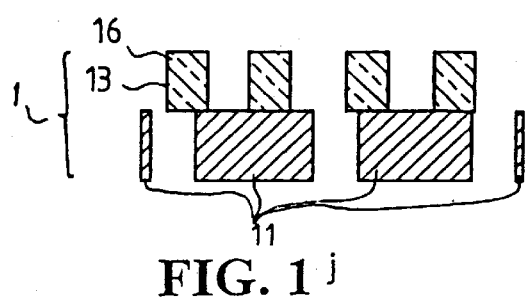
Figure 1K:
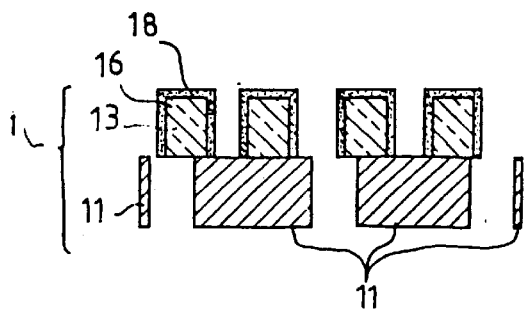

For the purpose of promoting an understanding of the principles of the invention, reference will now be made to the embodiment illustrated in the drawings. Specific language will be used to describe same. It will, nevertheless, be understood that no limitation of the scope of the invention is thereby intended, such alterations and further modifications in the illustrated device, and such further applications of the principles of the invention as illustrated herein being contemplated as would normally occur to one skilled in the art to which the invention relates.

Figure 2A:
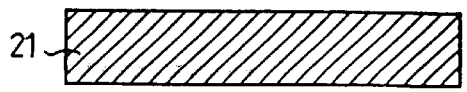
FIGS. 2*a*, 2*b*, 2*c*, 2*d*, 2*e*, 2*f*, 2*g*, 2*h*, 2*I*, 2*j* and 2*k* illustrate the process of manufacturing thin ball grid array substrates.
Figure 2B:
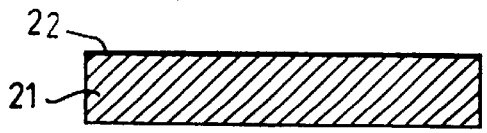
Figure 2C:
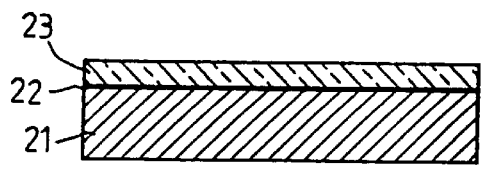
Figure 2D:
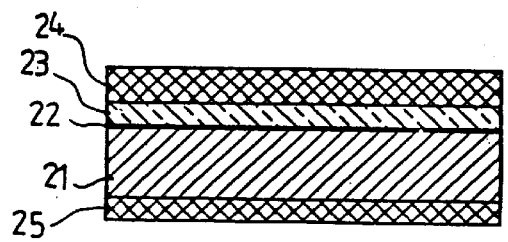
Figure 2E:
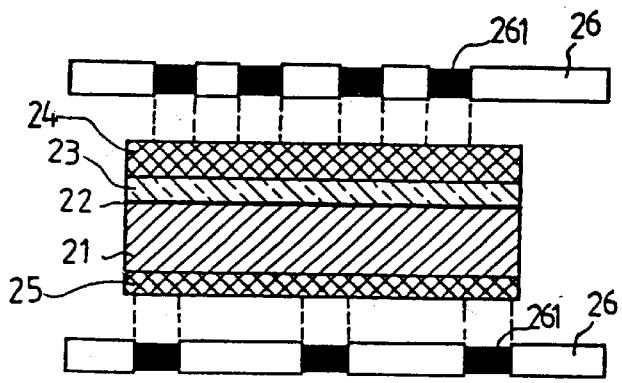
Figure 2F:
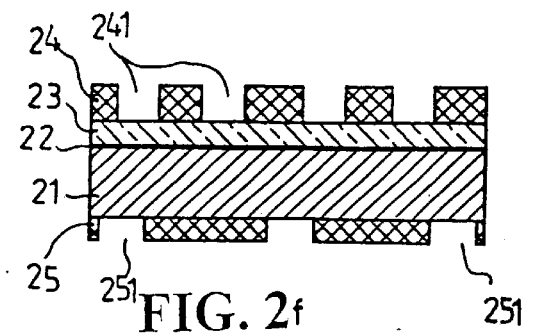
Figure 2G:
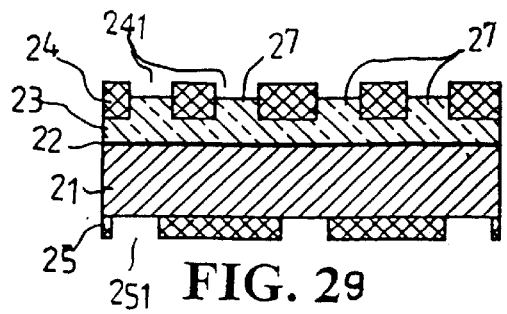
Figure 2H:
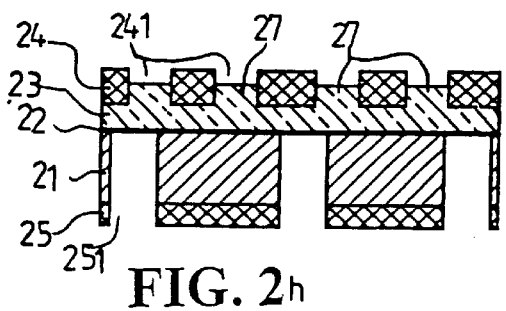
Figure 2I:
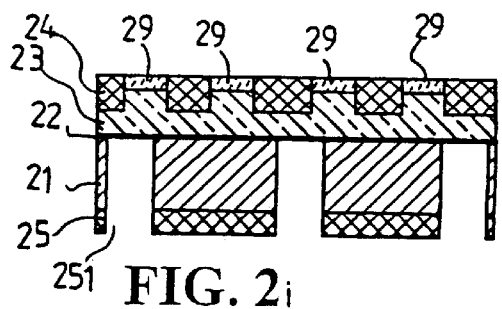
Figure 2J:
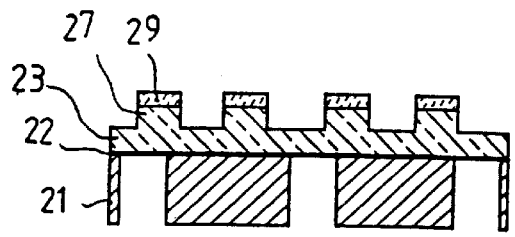
Figure 2K:
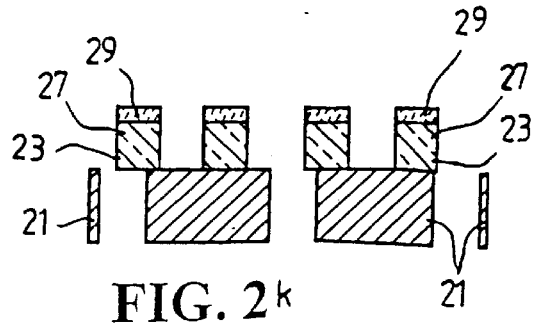

The process of manufacturing thin ball array substrates according to the present invention comprises the steps of (see FIGS. 1*a*–1*k*):

a. using a layer of polyimide film 21 as a carrier 2;

b. sputtering a thinner copper layer 22 on the polyimide film 21;

c. flash plating a thicker copper layer 23 on the thinner copper layer 22 for providing a medium for electroplating thereafter;

d. applying photosensitive coating layers 24 and 25 of appropriate thickness on the top and bottom of the carrier 2;

e. mounting a mask 26 with optically transmissible circuit tracks 261 on each of the top and bottom of the carrier 2 and then processing the carrier 2 with exposure treatment (the pattern design of the photomask does not have any superfluous electroplating bus line);

f. processing the carrier 2 with development treatment so as to remove the photosensitive coating layers 24 and 25 aligned with the circuit track 261 thereby forming recessed circuit tracks 241 and 251 on the photosensitive coating layers 24 and 25;

g. electroplating a copper layer 27 on the top of the carrier 2 thereby forming an additional copper layer on the copper layer 23 with a top slightly lower than that of the photosensitive coating layer 24;

h. etching the bottom of the carrier 2 to remove the recesses circuit track 251 on the bottom, i.e. removing the polyimide film 11 not covered with the photosensitive coating layer 25;

i. coating the copper layer 27 on the recessed circuit track 241 with soldering metallic material 29 (such as an alloy of tin and lead, 63Sn/37Pb) so as to make the top of the soldering metallic material 29 even with the top of the photosensitive coating layer 24 (the soldering material 29 is also used as a copper etching resisting element);

j. washing away the photosensitive coating layers 24 and 25 with a chemical agent;

l. removing surplus copper layer 23 resulting in circuit lines 3 (see FIG. 2K) and soldering metallic material 29 remaining.

Finally, tin balls are provided on the soldering metallic material 29 so that it is unnecessary to keep electroplating lines for coating nickel or gold on the circuit lines. The electroplating lines for coating the copper layer 27 on the copper layer 23 are removed together with the copper layer 23 at the step k of the process. Consequently, the present invention can provide a thin ball grid array substrate with thicker circuit lines without remaining electroplating lines.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

What is claimed:

1. A process of manufacturing thin ball array substrates comprising steps of:

a. using a layer of polyimide film as a carrier;

b. electroplating a thin copper layer on said polyimide film;

c. electroplating a thick copper layer on said thin copper layer for providing a medium for electroplating thereafter, d. applying a first photosensitive coating layer on a top of said carrier and a second photosensitve coating layer on a bottom of said carrier;

e. mounting two masks with optically transmissible circuit tracks on two sides of said carrier and then processing said carrier with exposure treatment;

f. processing said carrier with development treatment so as to remove said photosensitive coating layers aligned with said circuit track thereby forming a first recessed circuit track on said first photosensitive coating layer and a second recessed circuit track on said second photosensitive coating layer;

g. electroplating a copper layer on a top of said carrier thereby forming an additional copper layer on said thick copper layer with a top slightly lower than that of said first photosensitive coating layer;

h. etching a bottom of said carrier to remove said second recessed circuit track thereon, i.e. removing said polyimide film not covered with said second photosensitive coating layer;

i. coating said copper layer on said first recessed circuit track with soldering metallic material so as to make a top of said soldering metallic material even with a top of said photosensitive coating layer;

j. washing away said photosensitive coating layers with a chemical agent;

k. removing the surplus copper layer resulting in the circuit lines and said soldering metallic material remaining.

* * * * *